(12) United States Patent
Brice

(10) Patent No.: US 6,932,865 B2
(45) Date of Patent: Aug. 23, 2005

(54) SYSTEM AND METHOD OF MAKING SINGLE-CRYSTAL STRUCTURES THROUGH FREE-FORM FABRICATION TECHNIQUES

(75) Inventor: Craig A. Brice, Keller, TX (US)

(73) Assignee: Lockheed Martin Corporation, Bethesda, MD (US)

(*) Notice: Subject to any disclaimer, the term of this patent is extended or adjusted under 35 U.S.C. 154(b) by 145 days.

(21) Appl. No.: 10/412,379

(22) Filed: Apr. 11, 2003

(65) Prior Publication Data

US 2004/0200404 A1 Oct. 14, 2004

(51) Int. Cl.⁷ .............................................. C30B 13/08
(52) U.S. Cl. ........................ 117/40; 117/41; 117/43; 117/44; 117/46; 117/47
(58) Field of Search ............................. 117/40, 41, 43, 117/44, 46, 47

(56) References Cited

U.S. PATENT DOCUMENTS

| | | | | |
|---|---|---|---|---|
| 3,801,290 A | * | 4/1974 | Makino et al. ............... | 117/50 |
| 4,177,372 A | * | 12/1979 | Kotera et al. ................. | 117/39 |
| 4,564,403 A | * | 1/1986 | Hayafuji et al. ............. | 117/43 |
| 4,576,676 A | * | 3/1986 | Smith et al. ................. | 438/488 |
| 4,585,512 A | * | 4/1986 | Hayafuji et al. ............. | 117/44 |
| 4,599,133 A | | 7/1986 | Miyao et al. ........... | 156/617 R |
| 5,208,187 A | * | 5/1993 | Tsubouchi et al. .......... | 438/607 |
| 5,437,820 A | | 8/1995 | Brotz .......................... | 264/25 |
| 5,617,911 A | | 4/1997 | Sterett et al. ................ | 164/457 |
| 5,718,951 A | | 2/1998 | Sterett et al. ................ | 427/466 |
| 5,746,844 A | | 5/1998 | Sterett et al. ................ | 148/522 |
| 5,787,965 A | | 8/1998 | Sterett et al. ............. | 164/155.3 |
| 5,837,960 A | | 11/1998 | Lewis et al. ........... | 219/121.63 |
| 5,960,853 A | | 10/1999 | Sterett et al. ................ | 164/271 |
| 5,998,097 A | | 12/1999 | Hatakeyama et al. ....... | 430/296 |
| 5,998,997 A | | 12/1999 | Ramanathan et al. | |
| 6,024,792 A | | 2/2000 | Kurz et al. | |
| 6,046,426 A | | 4/2000 | Jeantette et al. ....... | 219/121.63 |
| 6,268,584 B1 | | 7/2001 | Keicher et al. ........ | 219/121.64 |
| 6,589,447 B1 | * | 7/2003 | Ishizaki et al. .......... | 252/501.1 |

FOREIGN PATENT DOCUMENTS

| | | |
|---|---|---|
| DE | 38441517 A1 | 8/1989 |
| WO | WO/97/45827 | 12/1997 |
| WO | WO 02/00963 A1 | 1/2002 |

* cited by examiner

*Primary Examiner*—Robert Kunemund
(74) *Attorney, Agent, or Firm*—Bracewell & Giuliani LLP

(57) ABSTRACT

A single-crystal structure is grown using free-form fabrication through principles of directional solidification and direct-deposition techniques. The structure is formed from a metallic alloy by building from feedstock on top of and upward from a heated base element. The top of the structure is also heated with a scanning beam as it is built. The higher temperatures near the melting alloy tend to promote crystal growth rather than nucleation as the grain grows toward the heat of the scanning beam. This allows a two-dimensional thermal gradient to be formed in the build direction, which allows the solid crystal to maintain one orientation during the deposition process. As the material initially solidifies, it nucleates off of a desired grain that is designated by a grain selector. This method eliminates the need for expensive mold cavities and segmented furnaces that are typically required by prior art processes for producing some components.

15 Claims, 1 Drawing Sheet

SYSTEM AND METHOD OF MAKING SINGLE-CRYSTAL STRUCTURES THROUGH FREE-FORM FABRICATION TECHNIQUES

BACKGROUND OF THE INVENTION

1. Technical Field

The present invention relates in general to an improved fabrication technique and, in particular, to an improved apparatus and method of making a single-crystal structure through free-form fabrication techniques.

2. Description of the Related Art

Metal objects are currently produced by thermomechanical processes which include casting, rolling, stamping, forging, extrusion, machining, and joining operations. Multiple steps are required to produce a finished article. These conventional operations often require the use of heavy equipment and molds, tools, and dies. For example, a typical process sequence required to form a small cylindrical pressure vessel might include casting an ingot, heat treating and working the casting to homogenize it by forging or extrusion or both, then machining a hollow cylinder and, separately, end caps from the worked ingot and, finally, welding the end caps to the cylinder. This invention provides a method for forming such an article in a single operation and using less equipment. An article formed by laser deposition is relatively free of internal stresses in comparison to an article formed by welding one or more components together. Also, joining components by means of welding requires equipment just for the single step of joining and time to set up the equipment to do the job.

Conventional production methods are subtractive in nature in that material is cut away from a starting block of material to produce a more complex shape. Subtractive machining methods are deficient in many respects. Large portions of the starting material are reduced to waste in the form of cuttings. These methods produce waste materials, such as metal cuttings, oils, and solvents, which must be further processed for purposes of reuse or disposal. The articles produced are contaminated with cutting fluids and metal chips. They require cutting tools which wear and must be periodically reconditioned and ultimately replaced. Fixtures for use in manufacturing must be designed, fabricated, and manipulated during production. When a part is unusual in shape or has internal features, machining is more difficult. Choosing the machining operations to be used and the sequence of operations requires a high degree of experience. A number of different machines are needed to provide capability to perform the variety of operations which are often required to produce a single article. Sophisticated machine tools require a significant capital investment and occupy a good deal of space. Use of the invention in place of subtractive machining provides solutions to these problems and disadvantages. The inventive process may be characterized as additive in nature. The raw material which does not become part of an article is easily collected and re-used without processing. There is no need to dispose of waste liquids and metal cuttings and the articles produced are not contaminated by these materials. Fixtures and cutting tools are not required. All work needed to produce an article is accomplished using a computer workstation and a single production station.

Another difficulty with conventional machining techniques is that many objects must be produced by machining a number of parts and then joining them together. Producing parts separately and joining them requires closetolerance machining of matching parts, provision of fastening means, such as threaded connections, and welding together of components. These operations involve a significant portion of the cost of producing an article, as they require time for design and production as well as apparatus for performing them.

Typically, items formed using direct-deposition methods have polycrystalline grain structures that grow with their crystal lattices in various directions. This occurs due to nucleation at multiple sites, and the result is growth of misaligned crystal lattices that extend toward each other, with the lattices abutting at the grain boundaries. While this may be allowable in some applications, the grain boundaries allow for the "creep" mechanism of deformation to occur in applications where the material experiences elevated temperatures and high-stress and/or stress for long durations. Conditions such as these are common for applications such as turbine blades in jet engines.

In conventional directional solidification, a mold is filled with molten metal and slowly cooled from one direction. This forms a two-dimensional, formal gradient which allows the solid crystal to grow in one direction, thus maintaining its preferred orientation. Single-crystal materials also may be made through a variety of other methods including gradient cooling in investment castings (floating zone method), Czochralski crystal pulling, etc. Although each of these methods is workable, they do have disadvantages. For example, some of these methods require expensive mold cavities, fixtures, and tightly-controlled and/or segmented furnaces to produce some components. Still other prior art methods have additional disadvantages. See, e.g., U.S. Pat. No. 5,837,960 to Lewis, et al; U.S. Pat. No. 5,437,820 to Brotz; U.S. Pat. No. 6,046,426 to Jeantette, et al; U.S. Pat. No. 4,599,133 to Miyao, et al; U.S. Pat. No. 5,998,097 to Hatakeyma, et al; and U.S. Pat. No. 5,960,853 to Sterrett, et al. The components utilized by these inventions can add very significant cost and lead times for producing the end products. Thus, an improved apparatus, system, and method of producing single-crystal structures that avoids or eliminates many of the disadvantages of the prior art is needed and would be desirable.

SUMMARY OF THE INVENTION

One embodiment of an apparatus and method of growing single-crystal structures according to the present invention produces the structures using free-form fabrication techniques. In one embodiment, the principles of directional solidification are combined with direct-deposition techniques using lasers or high energy-density beams in a vacuum or inert environment to create bulk, single-crystal structures. The device of the present invention forms a component, such as a single-crystal turbine blade, from a metallic alloy without undesirable grain structure. The component is built from feedstock on top of and upward from a heated base element. The top of the component is also heated with a scanning beam. The higher temperatures which are near the melting temperature of the alloy tend to promote crystal growth rather than nucleation as the grain grows toward the heat of the scanning beam. As the material initially solidifies, it nucleates off of a desired grain that is designated by a grain selector.

The present invention has the advantage of simplifying the method for producing single-crystal structures. The present approach is to apply free-form fabrication techniques utilizing multiple heat sources for controlling the temperature gradient in the structure to directly form the single-crystal structure. This method eliminates the need for expensive mold cavities and segmented furnaces that are typically required by prior art processes for producing some components. The method described herein is an improvement over the prior art because it allows single crystals to be directly formed without the need for casting molds, fixtures, furnaces, etc., and thereby reduces both the cost and the lead time for producing such items.

In direct deposition, a high energy-density beam deposits feedstock material on a substrate to form a three-dimensional object. By using techniques currently available for beam-splitting (or by using multiple beams), the top surface of the build is maintained at a constant temperature. This allows a two-dimensional thermal gradient to be formed in the build direction, which allows the solid crystal to maintain one orientation during the deposition process. The resulting structure is built directly from common feedstock materials, such as powder, wire, etc. In one embodiment, this technique slowly grows columnar or axial grains with the thermal gradient to produce turbine blades that are very strong and resistant to creep deformation.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features and advantages of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF AN ILLUSTRATIVE EMBODIMENT

Figure 1:
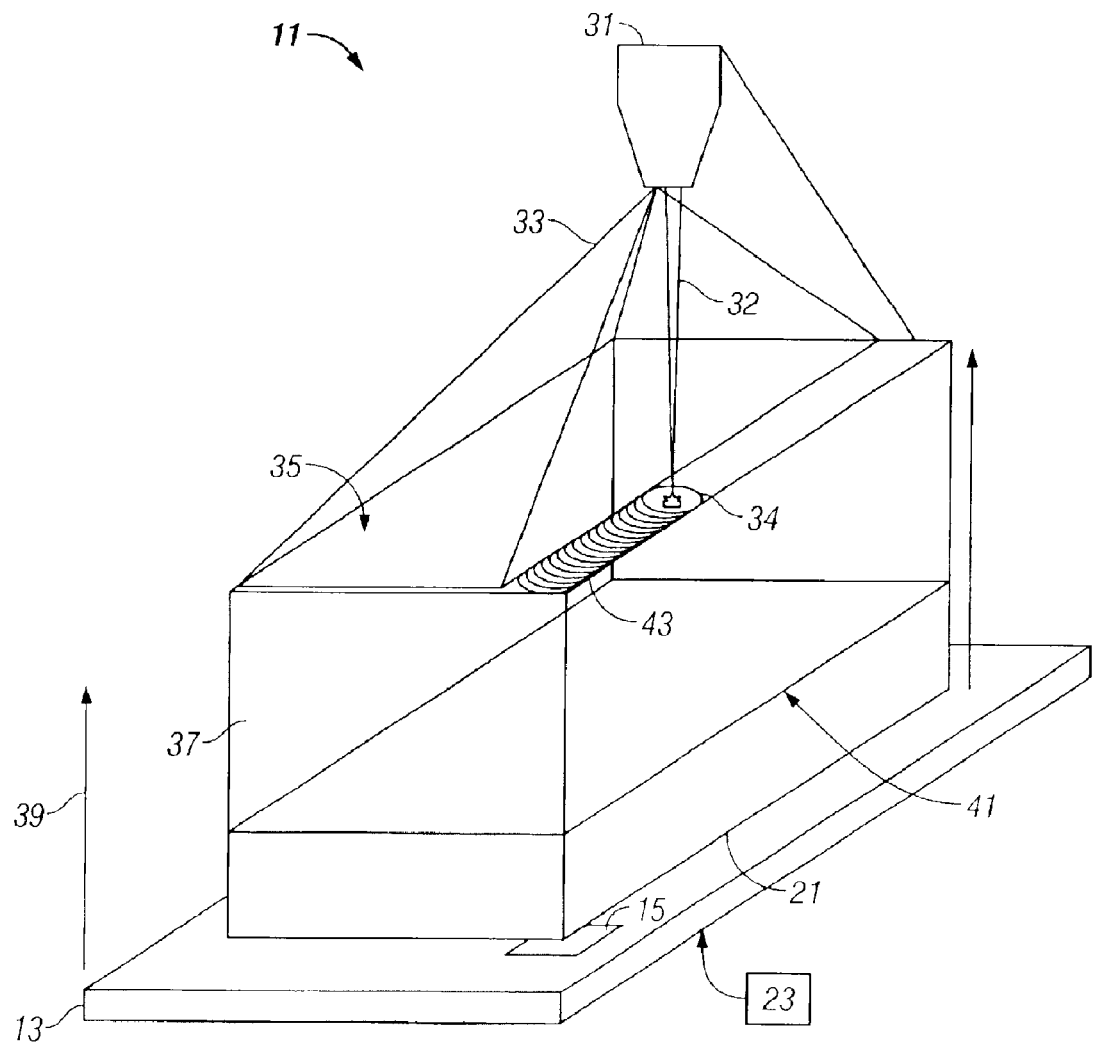
FIG. 1 is an isometric diagram of one embodiment of a system and method of growing single-crystal structures through a free-form fabrication techniques and is constructed in accordance with the present invention.

Referring to FIG. 1, one embodiment of an apparatus 11, system, and method of growing a bulk, single-crystal structure using free-form fabrication techniques is shown. In one version of the invention, the entire series of steps takes place in a vacuum or inert atmosphere. The apparatus 11 includes a substrate 13 having a desired crystalline grain that is designated by a grain selector 15. Grain selector 15 is shown schematically for purposes of illustration, but comprises a system such as those commonly known in the art. A feedstock 21, such as a metallic alloy of powder, wire, etc., is placed on the substrate 13.

Apparatus 11 utilizes multiple heat sources for controlling a very precise temperature gradient in the structure being built to directly form the single-crystal structure. For example, one heat source is in the substrate 13. Substrate 13 is evenly heated by a source of heat 23, such as those commonly known in the art, and, thereby, heats the feedstock 21 to an initial desired temperature. The particular depiction of grain selector 15 and heat source 23 are not intended to be limiting or indicative of their actual configuration in any way, but are merely illustrated in the manner shown for convenience.

In the embodiment shown, another heat source for the apparatus 11 is a scanning beam system 31. Scanning beam system 31 may utilize a single laser, a high energy-density beam, or multiple independent beams. In one embodiment, a single scanning beam is a split into a plurality of beams to accomplish all of the scanning beam steps of the present invention, as will be described below.

One purpose of the scanning beam system 31 is to apply deposition energy 32, typically in the form of a beam, to the upper surface 35 of the feedstock 21. As deposition energy 32 is applied, material 34 is deposited on the feedstock 21 to form a build 37 having a build direction 39, which is upward from the substrate 13. The build direction 39 also indicates a first (vertical) dimension of the two dimensions of a thermal gradient formed by apparatus 11.

Another purpose of the scanning beam system 31 is to apply a scanning beam 33 to an upper surface 35 of the feedstock 21 to further heat the entire upper surface of the feedstock 21 (other than a deposition surface area) to a temperature that exceeds the desired temperature. Scanning beam 33 forms a second (horizontal) dimension 41 of the thermal gradient formed by apparatus 11. The second dimension 41 of the two-dimensional thermal gradient is evenly distributed parallel to the build direction 39, and is indicated by the isothermal cross-section depicted in FIG. 1, which is normal to the build direction 39. The deposition surface area 43 is defined as the surface area of the build 37 that has already had the deposition energy 32 applied to it.

The scanning beam 33 is applied to an upper portion of the feedstock simultaneously with the deposition energy 32 to melt a portion of the upper surface 35 of the feedstock 21 to form the build 37. The scanning beam 33 is moved across the entire upper surface 35 of the feedstock 21 to maintain the entire upper surface 35 at a constant temperature such that the two-dimensional thermal gradient is formed in a build direction 39.

As a result of the application of energy via scanning beam 33 and deposition energy 32, a solid single crystal is nucleated and maintained in the build 37 based on the desired grain of crystal selector 15 as the melted portion of the build 37 solidifies. The higher temperatures of the build 37 that are near the melting temperature of the feedstock 21 promote crystal growth in the one orientation of the desired grain during the deposition process.

The single crystal growth is accomplished rather than promoting additional nucleation, as the grain of the single crystal grows toward the heat of the scanning beam 32. As the deposition energy 32 is slowly moved continuously across the entire surface area 35 in a consistent pattern, a solid three-dimensional structure is fabricated from the build 37 on top of and upward from the substrate 13. The pattern of application for deposition energy 32 may be varied according to the particular application. For example, a columnar or axial grain may be formed with the thermal gradient to form the basis of and build a single-crystal turbine blade.

The present invention has several advantages over the prior art, including the ability to grow single-crystal structures using free-form fabrication techniques. The principles of directional solidification are combined with direct-deposition techniques using lasers or high energy-density beams in a vacuum or inert environment to create bulk, single-crystal structures. The device of the present invention forms a component, such as a single-crystal turbine blade, from a metallic alloy without undesirable grain structure. The higher temperatures which are near the melting temperature of the alloy tend to promote crystal growth rather than nucleation as the grain grows toward the heat of the scanning beam. As the material initially solidifies, it nucleates off of a desired grain that is designated by a grain selector.

The present invention also has the advantage of simplifying the method for producing single-crystal structures. The present approach is to apply free-form fabrication techniques utilizing multiple heat sources for controlling the temperature gradient in the structure to directly form the single-crystal structure. This method eliminates the need for expensive mold cavities and segmented furnaces that are typically required by prior art processes for producing some components.

The method described herein is an improvement over the prior art because it allows single crystals to be directly formed without the need for casting molds, fixtures, furnaces, etc., and thereby reduces both the cost and the lead time for producing such items. Through the use of a beam-splitter or by using multiple beams, the top surface of the build is maintained at a constant temperature. This allows a two-dimensional thermal gradient to be formed in the build direction, which allows the solid crystal to maintain one orientation during the deposition process. The resulting structure is built directly from common feedstock materials, such as powder, wire, etc. This technique slowly grows columnar or axial grains with the thermal gradient to produce structures, such as turbine blades, that are very strong and resistant to creep deformation.

While the invention has been shown or described in only some of its forms, it should be apparent to those skilled in the art that it is not so limited, but is susceptible to various changes without departing from the scope of the invention.

What is claimed is:

1. A method of growing a single-crystal structure, comprising:
   (a) heating a feedstock with multiple heat sources simultaneously for controlling a two-dimensional temperature gradient in the feedstock, such that a portion of the feedstock is melted to form a build;
   (b) moving one of the multiple heat sources across the feedstock to maintain a surface of the build at a constant temperature such that the two-dimensional thermal gradient is formed in a build direction, thereby allowing a single crystal to maintain one orientation;
   (c) nucleating the single crystal in the build based on a desired grain orientation as the melted portion of the build solidifies, with higher temperatures of the build near a melting temperature of the feedstock promoting crystal growth during a deposition process, rather than nucleation, as a grain of the single crystal grows toward the heat of said one of the multiple heat sources; and
   (d) fabricating a solid three-dimensional structure from the build.

2. The method of claim 1, wherein step (a) comprises simultaneously heating an upper and a lower portion of the feedstock with independent heat sources, and melting at least part of the upper portion of the feedstock.

3. The method of claim 1, wherein all of the steps take place in an inert atmosphere.

4. The method of claim 1, wherein said one of the multiple heat sources is selected from a group consisting of a laser and a high energy-density beam.

5. The method of claim 1, further comprising the step of providing the feedstock as a metallic alloy.

6. The method of claim 1, wherein steps (a) and (b) comprise utilizing multiple independent beams.

7. The method of claim 1, wherein steps (a) and (b) comprise splitting a single scanning beam.

8. The method of claim 1, wherein steps (c) and (d) comprise forming a columnar grain with the two-dimensional thermal gradient.

9. A method of growing a bulk, single-crystal structure using free-form fabrication, comprising:
   (a) providing a substrate having a desired grain that is designated by a grain selector;
   (b) placing feedstock on the substrate and heating the substrate and, thereby, the feedstock, to a desired temperature;
   (c) applying a scanning beam to an upper surface of the feedstock to further heat an entire upper surface of the feedstock to a temperature that exceeds the desired temperature;
   (d) applying the scanning beam to an upper portion of the feedstock simultaneously with step (c) to melt a portion of the upper surface of the feedstock to form a build;
   (e) moving the scanning beam across the entire upper surface of the feedstock to maintain the entire upper surface at a constant temperature such that a two-dimensional thermal gradient is formed in a build direction;
   (f) nucleating and maintaining a solid single crystal in the build based on the desired grain of step (a) as the melted portion of the build solidifies, with higher temperatures of the build near a melting temperature of the feedstock promoting crystal growth in one orientation during a deposition process, rather than promoting additional nucleation, as a grain of the single crystal grows toward the heat of the scanning beam; and
   (g) fabricating a solid three-dimensional structure from the build on top of and upward from the substrate.

10. The method of claim 9, wherein all of the steps take place in a vacuum.

11. The method of claim 9, wherein the scanning beam is selected from a group consisting of a laser and a high energy-density beam.

12. The method of claim 9, further comprising the step of providing the feedstock as a metallic alloy of one of a powder and wire.

13. The method of claim 9, wherein steps (c) and (d) comprises utilizing multiple independent beams.

14. The method of claim 9, wherein steps (c) and (d) comprise splitting a single scanning beam.

15. The method of claim 9, wherein steps (f) and (g) comprise forming one of a columnar grain and an axial grain with the two-dimensional thermal gradient.

* * * * *